(12) United States Patent
Mallary

(10) Patent No.: US 7,292,414 B1
(45) Date of Patent: Nov. 6, 2007

(54) EXTERNAL COIL BIAS FOR GIANT MAGNETO-RESISTIVE SENSOR

(75) Inventor: Michael Mallary, Sterling, MA (US)

(73) Assignee: Maxtor Corporation, Longmont, CO (US)

( * ) Notice: Subject to any disclaimer, the term of this patent is extended or adjusted under 35 U.S.C. 154(b) by 287 days.

(21) Appl. No.: 10/269,159

(22) Filed: Oct. 11, 2002

Related U.S. Application Data

(60) Provisional application No. 60/345,199, filed on Nov. 9, 2001.

(51) Int. Cl.
G11B 5/127 (2006.01)
(52) U.S. Cl. ..................................... 360/324
(58) Field of Classification Search ................ 360/324, 360/125, 126, 317, 314, 316, 318, 327.21, 360/327.33; 428/694 TM
See application file for complete search history.

(56) References Cited

U.S. PATENT DOCUMENTS

| | | | |
|---|---|---|---|
| 4,656,546 A | 4/1987 | Mallory | 360/110 |
| 5,159,511 A * | 10/1992 | Das | 360/327.33 |
| 6,449,131 B2 * | 9/2002 | Guo et al. | 360/315 |
| 6,472,868 B1 | 10/2002 | Takayama et al. | |
| 6,560,069 B1 * | 5/2003 | Litvinov et al. | 360/126 |
| 6,642,714 B2 | 11/2003 | Kobayashi et al. | |
| 6,667,848 B1 * | 12/2003 | Khizroev et al. | 360/125 |
| 6,754,049 B1 * | 6/2004 | Seagle et al. | 360/317 |
| 2002/0028357 A1 * | 3/2002 | Shukh et al. | 428/694 TM |
| 2002/0036871 A1 * | 3/2002 | Yano et al. | 360/317 |
| 2002/0135935 A1 * | 9/2002 | Covington | 360/126 |
| 2003/0043513 A1 * | 3/2003 | Lin | 360/317 |

FOREIGN PATENT DOCUMENTS

| | | |
|---|---|---|
| JP | 59135624 A * | 8/1984 |
| WO | WO02/37131 A1 | 5/2002 |

OTHER PUBLICATIONS

Rottmayer "A New Design For an Ultra-High Density Magnetic Recording Head Using A GMR Sensor In the CPP Mode" IEE Transactions on Magnetics, vol. 31, No. 6 Nov. 1995.

* cited by examiner

*Primary Examiner*—Tianjie Chen
(74) *Attorney, Agent, or Firm*—Cesari and McKenna, LLP

(57) ABSTRACT

A disk includes a perpendicular recording disk, a head having a read portion to read information recorded on the perpendicular recording disk, a sensor in the read portion, and a coil structure, coupled to the read portion, to provide bias flux to the sensor. The coil structure may include two coils.

24 Claims, 7 Drawing Sheets

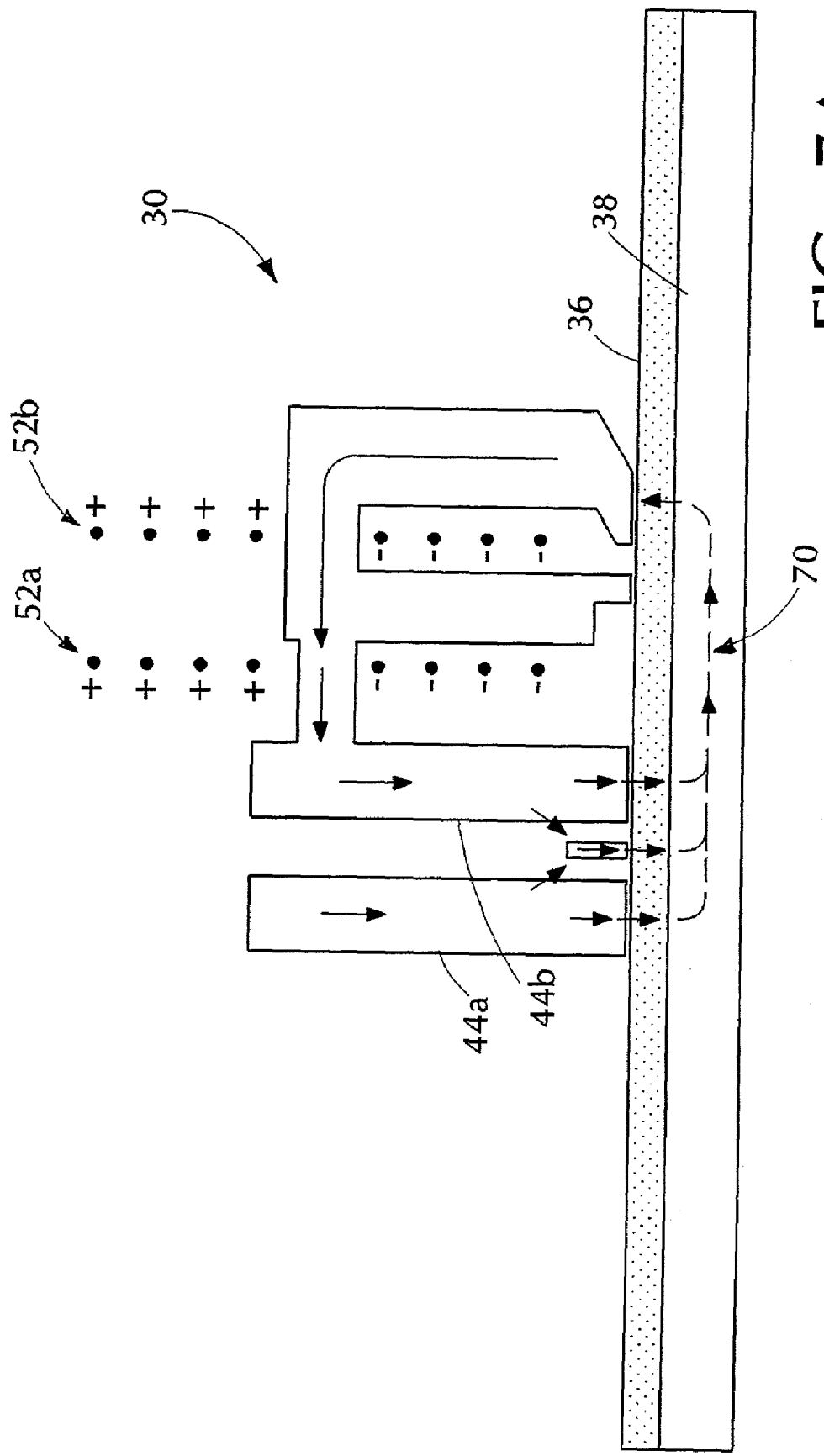

EXTERNAL COIL BIAS FOR GIANT MAGNETO-RESISTIVE SENSOR

CROSS REFERENCE TO RELATED APPLICATION

This application claims priority from U.S. Provisional Patent Application Ser. No. 60/345,199, filed Nov. 9, 2001, the contents of which are hereby incorporated by reference into this application as if set forth herein in full.

BACKGROUND

The present invention relates to perpendicular magnetic recording systems. Conventional perpendicular magnetic recording systems use Giant Magneto-Resistive (GMR) sensors to achieve high readback performance. One type of perpendicular recording system uses a Current Perpendicular to the Plane GMR (CPPGMR) sensor. In a read head that employs a CPPGMR sensor, a permanent magnet (PM) abutted to a CPPGMR sense element is used to provide a 90 degree bias angle between magnetizations in adjacent anti-ferromagnetic free layers of the GMR stack. With the PM biasing scheme, however, the 90 degree bias angle is achieved only in the center of the GMR stack where the signal flux is decayed by 50%. At the air bearing surface (ABS) where the signal flux is maximal, there is almost no bias. This results in gross asymmetry in the readback signal and loss of readback signal strength. While it is expected that the geometry and high AR/R of the CPPGMR sensor will become increasingly important at very high density, the asymmetry problem will limit the performance of the CPPGMR sensor.

In addition, the abutted PM junction is difficult to fabricate at extremely small dimensions that typically characterize applications of CPPGMR sensors. This fabrication problem is aggravated by the need to have the PM be electrically insulated from, yet magnetically coupled to, the CPPGMR sensor.

SUMMARY

In general, in one aspect, the invention is directed to a head for use in a perpendicular magnetic recording system. The head includes a read portion with a sensor and a coil structure, coupled to the read head portion, to provide bias flux to the sensor.

Embodiments of the invention may include one or more of the following features. The sensor may include a sense element having two free layers separated by a spacer layer. The bias flux may cause magnetization in the two free layers to be configured with a bias angle of approximately 90 degrees.

The coil structure may include two coils. The head may include a write portion and at least one of the coils may be located in the write portion. The write portion may include a write pole and a write pole shield. One of the coils may carry a current in one direction and the other of the coils may carry a current in the opposite direction during a write operation.

The read portion may include read shields on opposing sides of the sensor and the coils may provide current to the read shields. The coils may carry current in the same direction during a read operation. The bias flux may be provided to the sensor in a direction that is parallel to the plane of the sensor. The sensor may be a GMR sensor, a TMR sensor, or any other type of magnetic sensor.

In another aspect, the invention is directed to a disk drive that includes a perpendicular recording disk, a head comprising a read portion to read information recorded on the perpendicular recording disk, a sensor in the read portion, and a coil structure, coupled to the read portion, to provide bias flux to the sensor.

Particular implementations of the invention may provide one or more of the following advantages. The biasing of the coil structure provides for better bias flux distribution, thereby increasing the bias flux density at the ABS. In addition, the permanent magnet used in conventional GMR sensor designs can be eliminated from the sensor, thus reducing the complexity of its design and construction.

Other features and advantages of the invention will be apparent from the following detailed description, and from the claims.

BRIEF DESCRIPTION OF THE DRAWINGS

FIGS. 7A and 7B are depictions of the system (of FIG. 4) for read bias mode and write mode, respectively.

Like reference numerals in different figures indicate like elements.

DETAILED DESCRIPTION

Figure 1A:
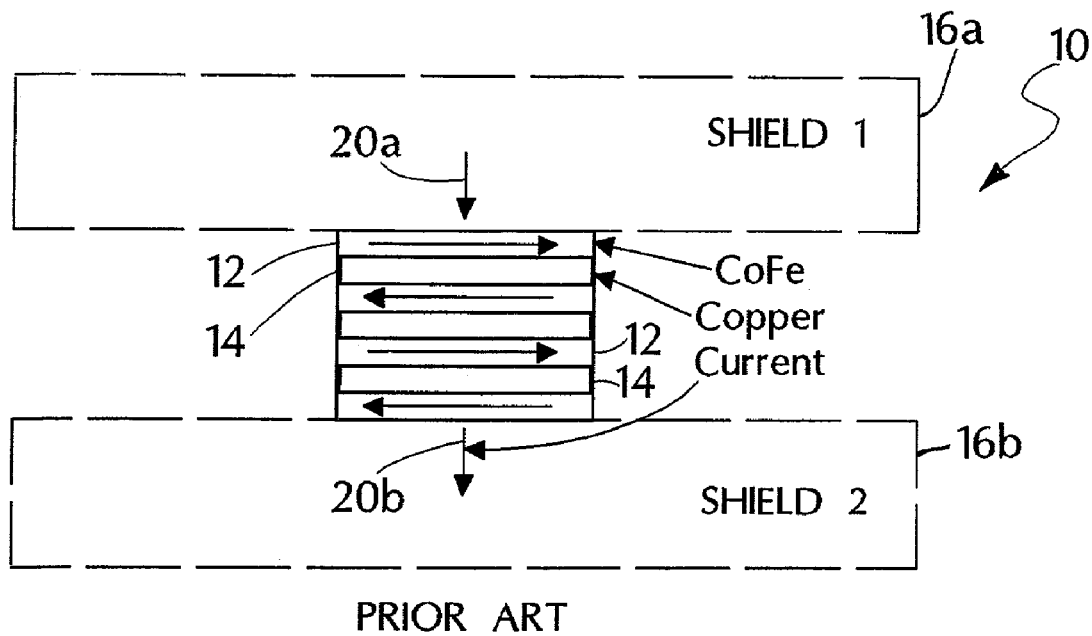
FIG. 1A is an air bearing surface (ABS) view of a prior GMR sensor including a stack of alternating free layers and spacer layers.

Referring to FIG. 1A, an air bearing surface (ABS) view of a GMR sensor 10 is shown. The GMR sensor 10 includes a stack of layers (GMR sense element), including alternating layers of free layer 12 and spacer layer 14. The stack can include other layers of material as well. Typically, the free layer 12 is made of a ferromagnetic material such as CoFe, and the spacer layer 14 is made of suitable transition material such as Cu. The stack resides between first and second read shields 16a, 16b in one or more layers of insulative "read gap" material (not shown). The shields and insulation are not part of the GMR sensor itself. One type of GMR sensor is a current perpendicular to the plane GMR (CPPGMR) in which current is brought to, and carried from, the sensor through the respective read shields 16a and 16b. The direction of that current is indicated by arrows 20a and 20*b*. When the sensor senses transitions from signal flux on a perpendicular medium, the magnetizations in adjacent ones of the free layers configure in positions referred to as "parallel", where the magnetizations are vertically oriented both in an upward direction, or "antiparallel", where the magnetizations are oriented horizontally pointing in opposite directions (as indicated by the horizontal arrows in the figure). The parallel position corresponds to a low resistance and the antiparallel position corresponds to a high resistance. The change in positions from one to the other indicates a magnetic transition, e.g., low resistance indicating a high transition and high resistance indicating a low transition. In and between these two positions, the device is said to be operating in a linear range.

In the absence of a bias of any kind, and due to the thickness of the copper (Cu) layer, the magnetizations of the adjacent free layers 12 gravitate towards the antiparallel position. Because the magnetizations prefer that position, it is difficult to change their positions even in the presence of strong signal flux indicating a high transition.

Figure 1B:
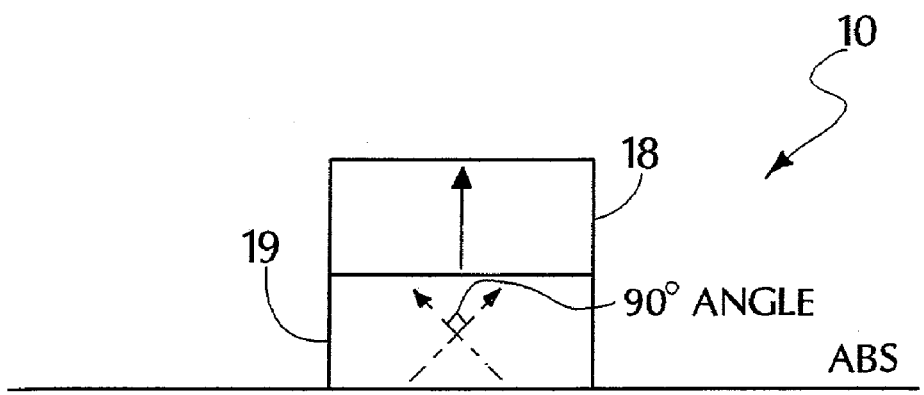
FIG. 1B is a plan view of the prior GMR sensor, showing a permanent magnet (PM) used to bias magnetization in the free layers.
Figure 2:
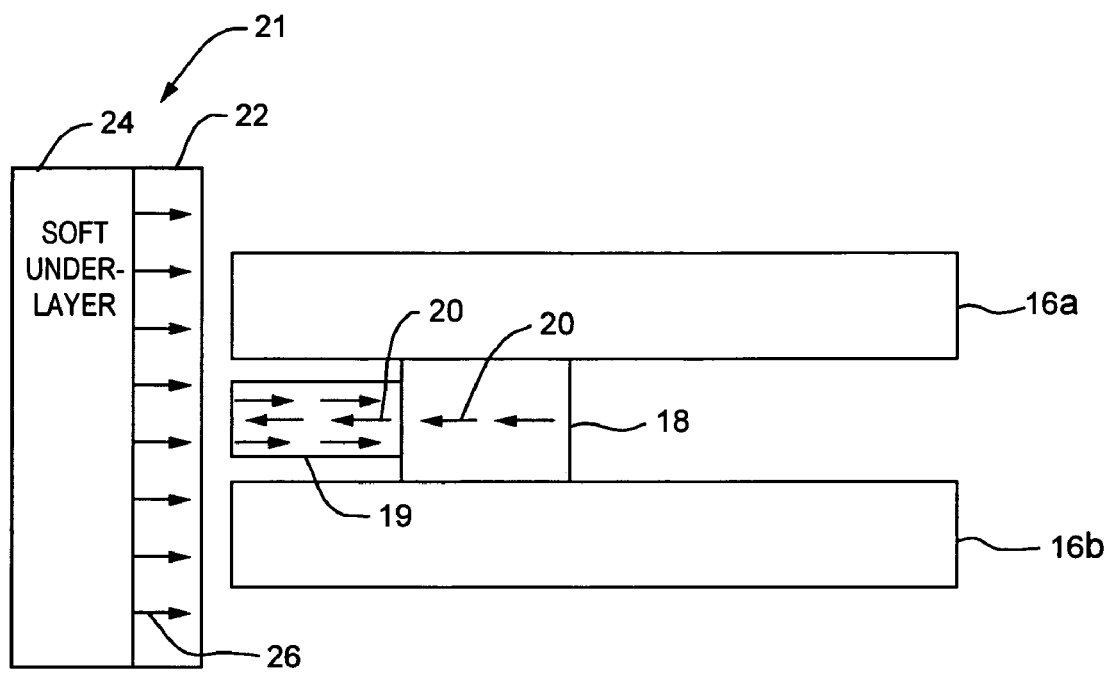
FIG. 2 is a side view of the GMR sensor (of FIGS. 1A and 1B), read shields and perpendicular medium, illustrating the biasing of the PM.
Figure 3:
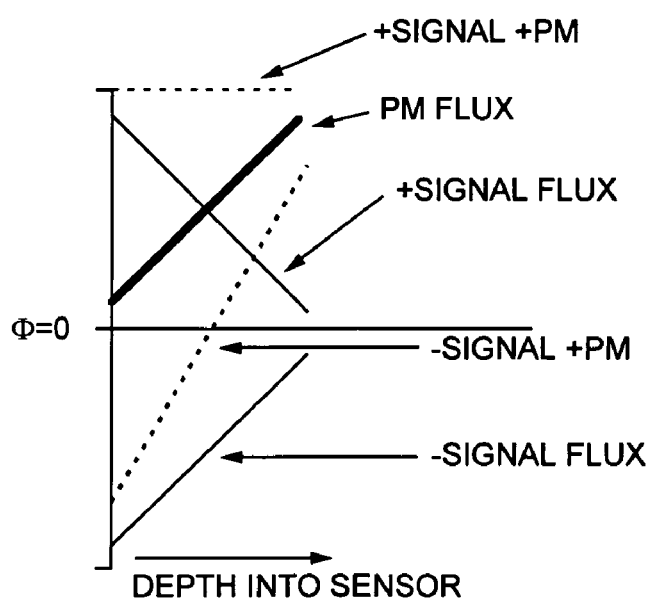
FIG. 3 is graphical depiction of the relationship between flux densities, both signal and PM, and the sensor depth (from ABS to PM junction).

Referring to FIG. 1B, shown in plan view, the GMR sensor 10 includes a permanent magnet (PM) 18 to bias the magnetizations in the stack or sense element (indicated by reference number 19) so they orient themselves at a 90 degree angle (known as "transverse biasing") relative to each other when the sensor is in a quiescent state, thus enabling them to move between the parallel and antiparallel positions for correct device operation. This biasing approach results in the asymmetry problem discussed above. That is, and as is shown in a PM biasing of FIG. 2, bias flux density of bias flux (indicated by arrows 20) of the PM weakens between the PM and the ABS, where it is weakest because bias flux leaks out of the GMR element 19 into the neighboring shields 16. The view of FIG. 2 includes a perpendicular recording medium 21, which includes a recording layer 22 and a softer underlayer 24. The ABS is in contact with the signal flux (indicated by arrows 26) of the recording layer of the perpendicular medium where the density of that signal flux is maximal. This relationship between the flux densities (both signal and bias) and sensor depth is shown in FIG. 3.

Figure 4:
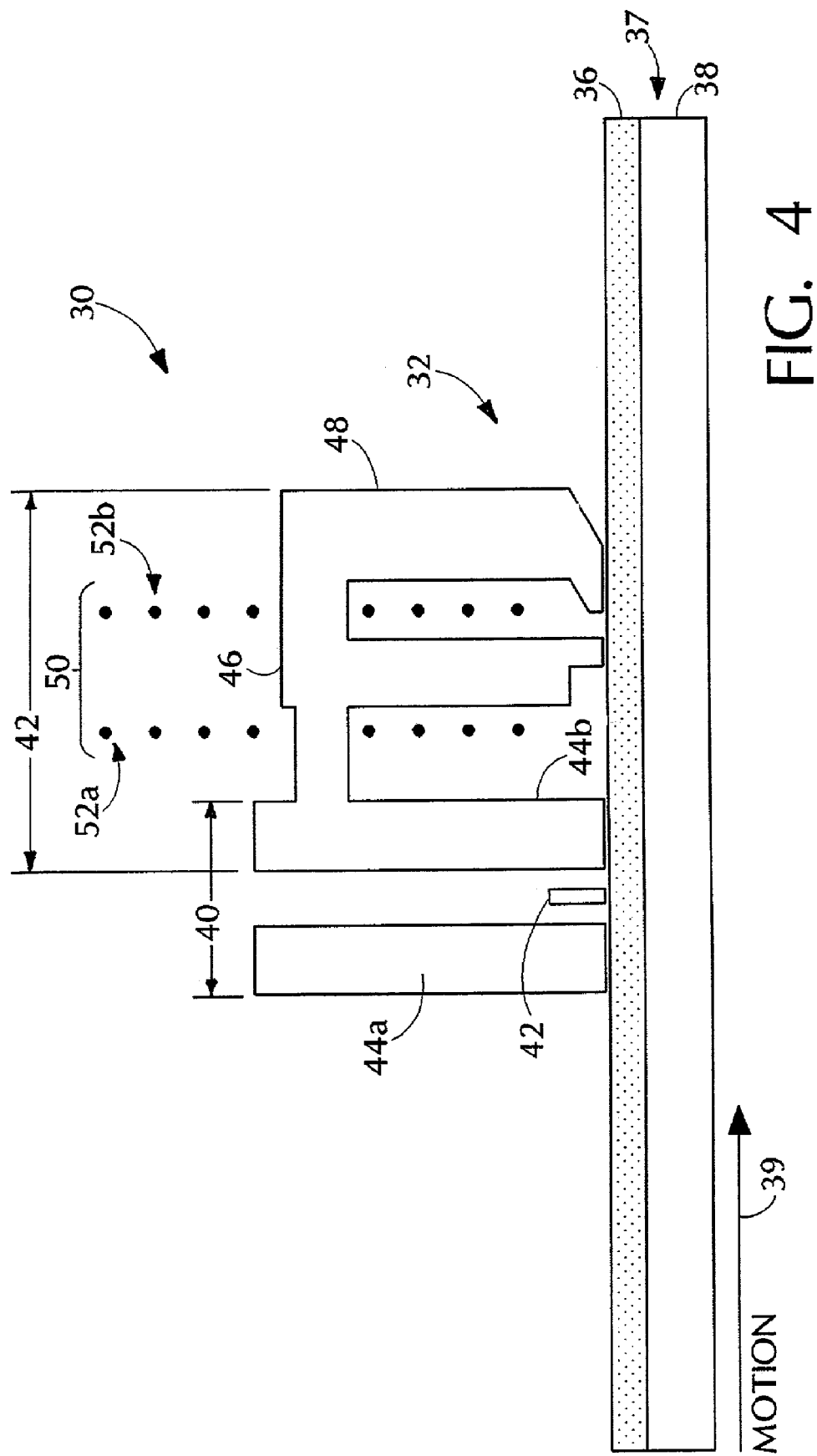
FIG. 4 is a partial side view of a perpendicular magnetic recording system including a head having a reader and shielded pole writer, and two external coils for biasing reader bias.

A more optimal biasing scheme is shown in FIG. 4. Referring to FIG. 4, a perpendicular recording system 30 (side view) is shown. Only those aspects of the system 10 pertaining to the biasing scheme are illustrated in the figure. The system 30 includes a read/write head 32, shown as a merged head, which records information on and reads recorded information from a perpendicular medium 34. In one embodiment, the perpendicular medium is a disk and the system 30 is a disk drive. The perpendicular medium 37 includes a recording layer 36 and a soft underlayer 38. Other layers may be included as well. The motion of the disk relative to the head is indicated by arrow 39. The head 32 includes a read portion ("reader") 40 and a write portion ("writer") 42. The read portion 40 includes a GMR sensor 42 which includes a sense element made of a GMR stack, e.g., as shown in FIG. 1, and read shields 44*a*, 44*b*. The write portion includes a write pole 46 and a write pole shield 48 for improved write field gradient. Collectively, structures 46 and 48 are referred to as a "shielded pole writer". One implementation of a shielded pole writer is described in U.S. Pat. No. 4,656,546, entitled "Vertical Magnetic Recording Arrangement," by Michael Mallary, which patent issued on Apr. 7, 1987 and was reissued to Mallary et al. on Jun. 2, 1992 as U.S. Pat. No. RE33,949, also entitled "Vertical Magnetic Recording Arrangement.". As emphasized in that disclosure, the downstream write pole shield area must be large by comparison to that of the write pole. When used as part of the CPPGMR read bias, it must also have an area that is at least as large as that of the read shields. This requirement prevents the down stream shield flux density from becoming large enough to cause thermal decay of the data.

Further included in the write portion 42 is a coil structure 50, including a first coil 52*a* and a second coil 52*b*. In the illustrated embodiment, the coils are spiral planar ("pancake") coils. In one embodiment, the coils are used for both writing and biasing the GMR sensor (to achieve the 90 degree bias angle in the adjacent free layers, as shown in FIG. 1B), as will be described.

Figure 5:
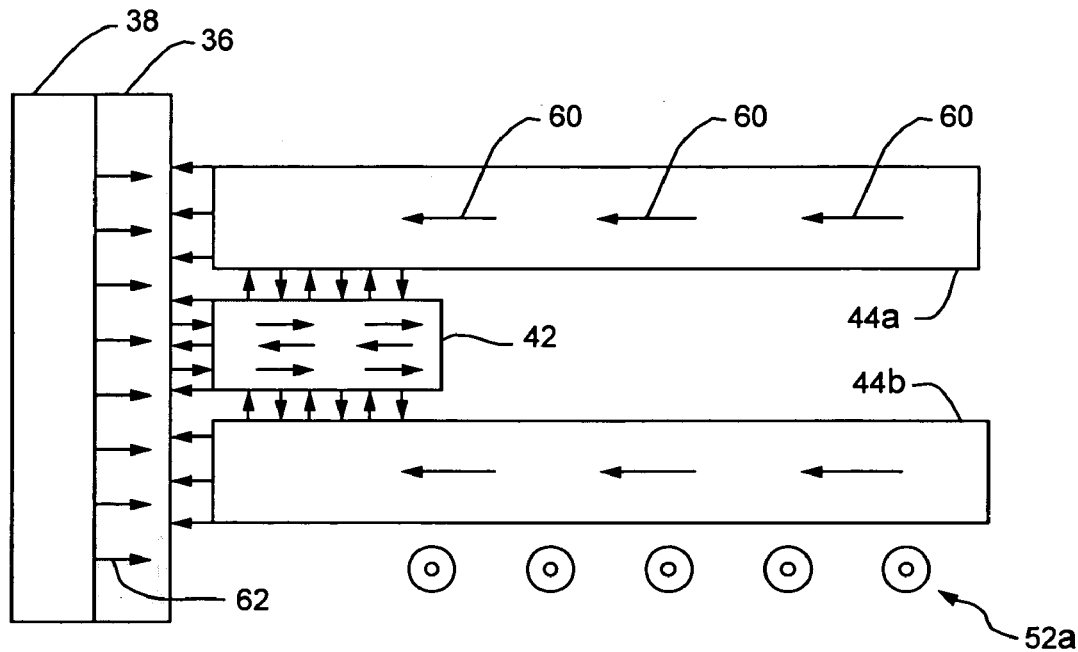
FIG. 5 is a side view of the reader of FIG. 4 and the medium, illustrating the coil biasing.

As shown in FIG. 5, when current is applied to the coils 52*a*, 52*b* (only a portion of coil 52*a* is shown here), the current induces a flow of bias flux (indicated by arrows 60) through the shields 44*a*, 44*b* and into the GMR sensor 42. When the sensor is quiescent, the bias flux causes the magnetizations in adjacent free layers of the sensor to align at a 90 degree angle (as shown in FIG. 1B). In the presence of signal flux (indicated by arrows 62) from the recording layer at the ABS, the magnetizations configure in either a parallel or antiparallel position.

Figure 6:
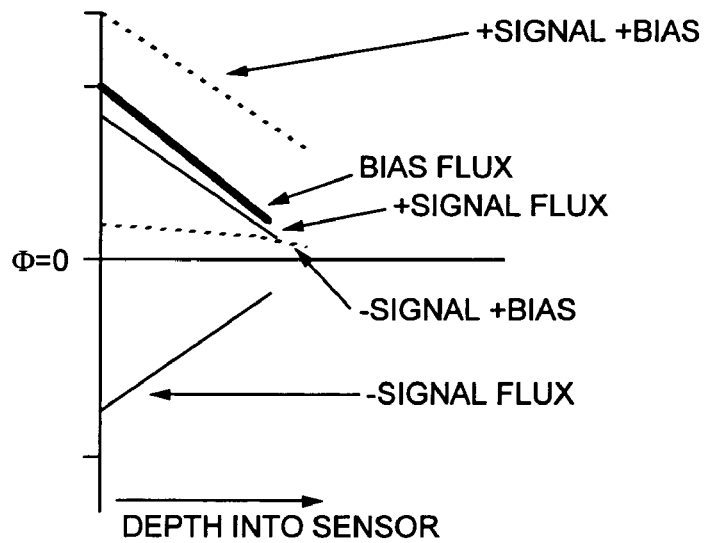
FIG. 6 is graphical depiction of the relationship between flux densities, both signal and bias, and the sensor depth.

FIG. 6 illustrates a comparison of the bias and signal flux densities as a function of sensor depth. It can be seen from the comparison that the external coil biasing provides for an optimum read bias flux density between the sensor ABS and the soft underlayer of the perpendicular media. Thus, such external coil biasing avoids the asymmetry problem seen with the PM biasing. The use of the external coil biasing also allows the PM to be eliminated from the sensor design, thereby simplifying the sensor's construction.

Figure 7B:
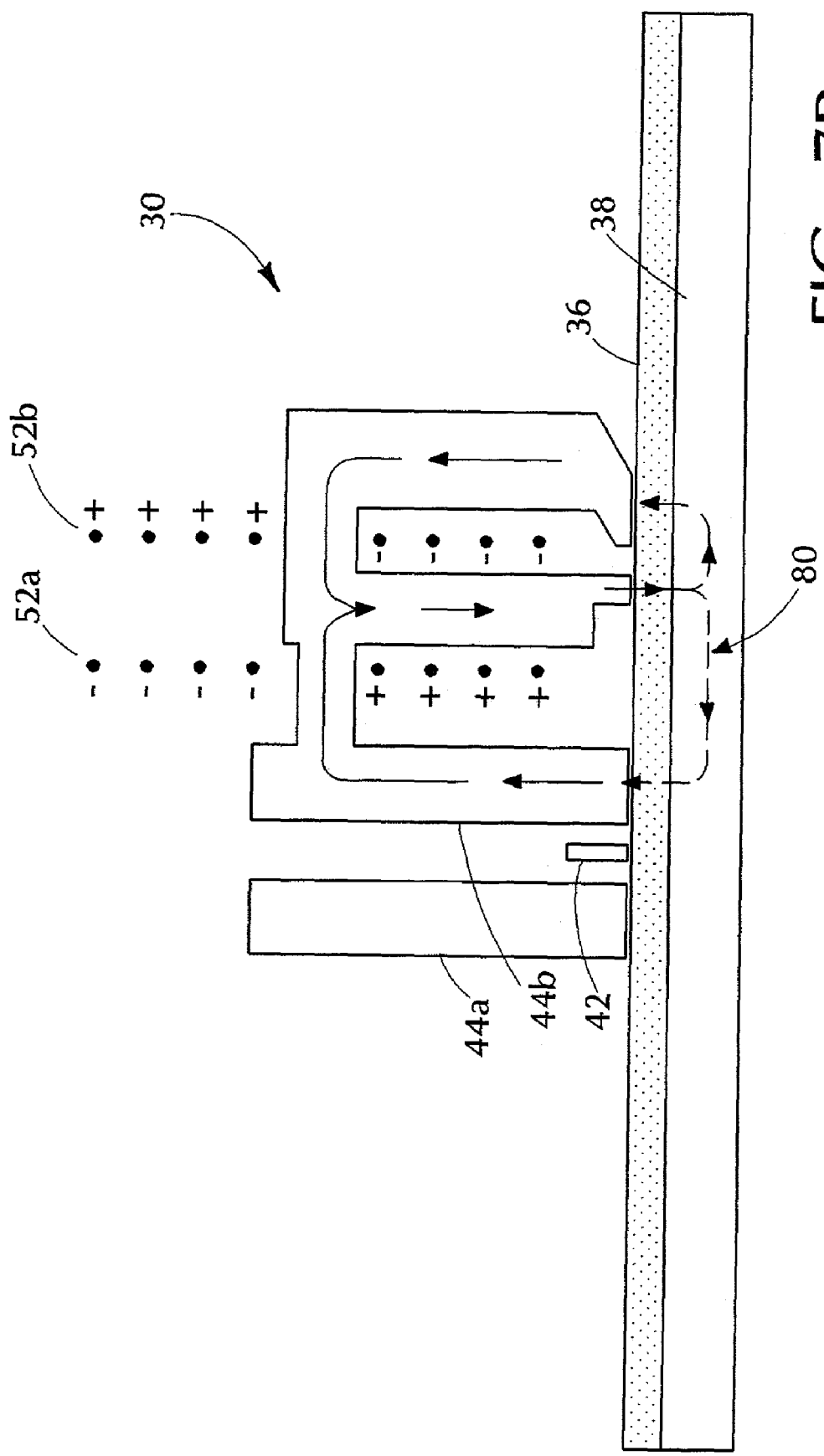

FIGS. 7A and 7B show the same view of the system 30 shown in FIG. 4, but further depict the direction of the current carried in the coils for read biasing (FIG. 7A) and a writer operation (FIG. 7B). For biasing, as shown in FIG. 7A, current is applied to both coils in the same direction ("parallel currents"). This may be referred to as a "common mode". Arrows 70 in this figure indicate the path of the bias flux through the shields, into the CPPGMR sensor, down through the soft underlayer of the medium and returned to the write pole shield. For writes, as shown in FIG. 7B, the direction of current is reversed in one of the coils, that is, current is flowing into the write portion through one pancake coil and is being carried away from the write portion in the other pancake coil ("antiparallel currents"). This mode may be referred to as a "differential mode". In FIG. 7B, arrows 80 are used to shown the write flux path during a write, from the write pole down through the soft underlayer and returning to the second shield and the write pole shield.

During sensor biasing, the currents in the two coils are adjusted so that little write field is generated at the tips of the write structures while achieving the bias flux in the GMR sensor. The magnetization fields of write structures, that is, the write pole and write pole shield, generated by the coils tend to buck each other during readback. During writes, the polarity of one of the coils is reversed such that the write fields of these write structures add to each other.

Figure 8:
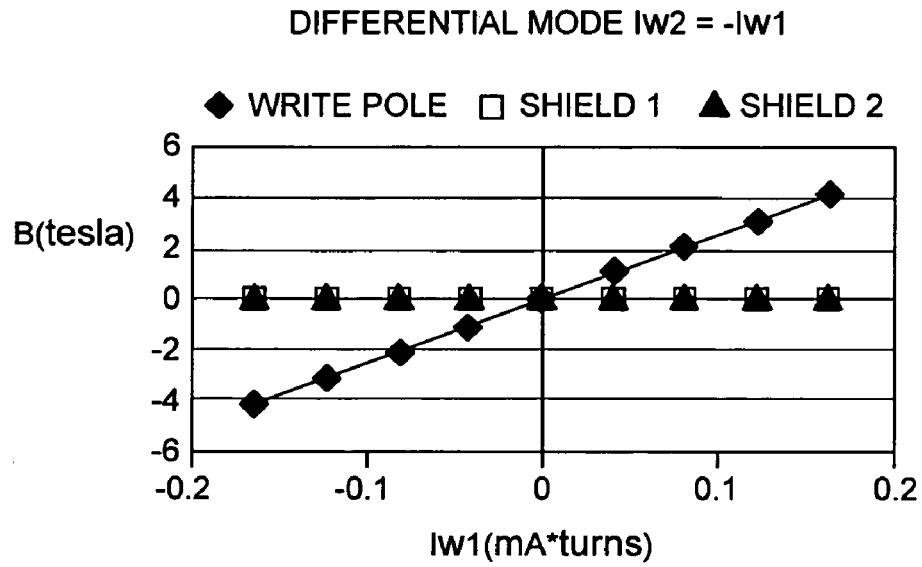
FIG. 8 is a graphical depiction of magnetization field strengths under write pole and read shields versus coil current for a write operation.
Figure 9:
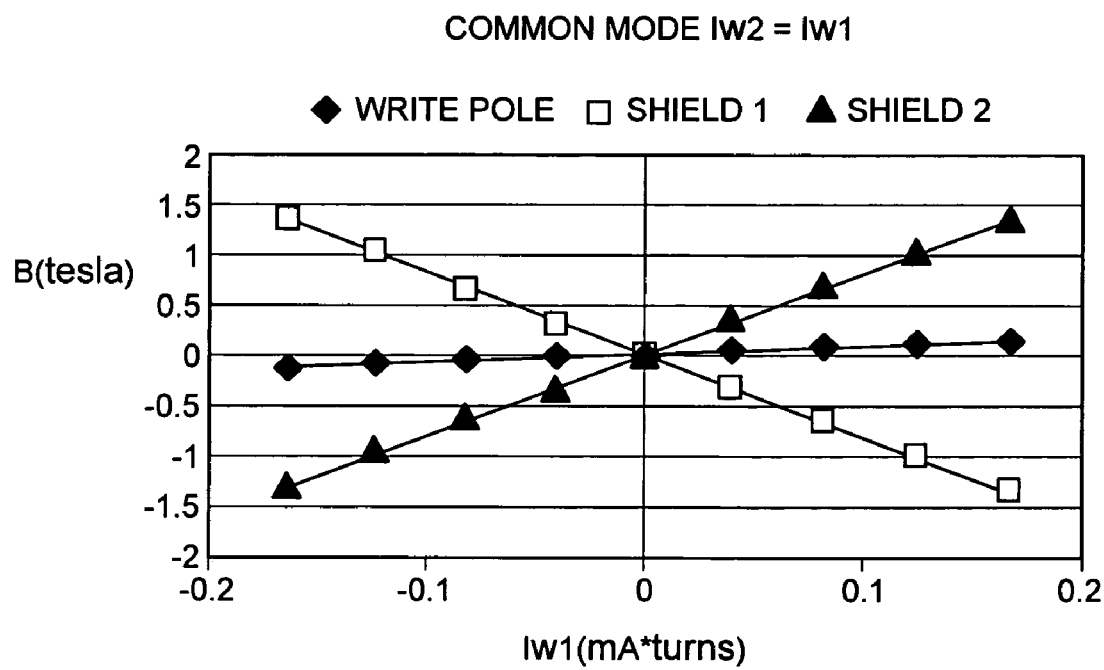
FIG. 9 is a graphical depiction of magnetization field strengths under write pole and read shields versus coil current for read bias operation.

A finite element analysis of the CPPGMR biasing using the external coil bias scheme, the results of which are depicted graphically in FIG. 8 and FIG. 9, shows that the optimal read bias state can be achieved with a negligible field under the write pole with parallel currents in the two coils. Antiparallel currents result in a high write field with low fields under the shield structures. In these figures, "Iw1" represents the current in coil 52*a* and "Iw2" represents the current in coil 52*b*.

Referring to FIG. 8, during write operation, a strong write field under the write pole and weak fields under the sensor shields are achieved using high antiparallel currents in the two coils (Iw2=−Iw1). The fields under the shields are much less that that under the write pole (e.g., <3%). With single coil single shield designs, the shield fields are typically as much as 10% of the write field during writes.

As shown in FIG. 9, during biasing, moderate bias fields under the shields (of a CPPGMR reader) and a low field under the write pole is achieved using parallel current in the coils (Iw1=Iw2). From the figure it is clear that the field under the write pole is essentially zero. A value not larger than the shield fields would be acceptable there.

The external coil biasing approach thus advantageously eliminates the need for a permanent magnet structure while requiring only the addition of one more lead/coil tap for the second coil. Moreover, the bias can be optimally adjusted for different head/media combinations.

Other embodiments are within the scope of the following claims. For example, although the biasing scheme is quite attractive for use with CPPGMR which has a AR/R value that is twice as large as that of current in the plane (CIP) GMRs, the external coiling biasing can be used with a CIPGMR as well. In addition to application to GMR sensors, this biasing scheme can be used with other types of magnetic sensors as well, such as tunneling magnetic resistive sensors (TMR). Also, although the coils are shown as part of a writer making use of the write coils for dual purposes, one of the biasing coils may be located outside of the writer. In another alternative embodiment, the writer can have one coil for writes and the head can include biasing coils that are not associated with the writer function at all. A hybrid approach in which the write coil provides only part of the bias while a PM provides the rest may also be used.

The external coil biasing mechanism can be used in other types of heads as well. For example, it will be appreciated that, while the illustrated embodiment is a merged head in which a single ferromagnetic layer functions as a second shield of the reader and as a return pole of the writer, the second shield and the return pole could be separate.

What is claimed is:

1. A head for use in a perpendicular magnetic recording system, comprising:
   a write portion that includes a write pole and a write pole shield;
   a read portion that includes a sensor and read shields on opposing sides of the sensor; and
   a coil structure, coupled to both the read and write portions, to provide a desired bias flux to the sensor during a read operation and write flux to the write pole during a write operation by providing flux to the read shields with a return through the write pole shield during a read operation and flux to the write pole with a return through one of the read shields and the write shield during a write operation.

2. The head of claim 1, wherein the sensor includes a sense element having two free layers separated by a spacer layer.

3. The head of claim 2, wherein the coil structure includes two coils.

4. The head of claim 3, wherein at least one of the coils is located in the write portion.

5. The head of claim 4, wherein both of the coils are located in the write portion.

6. The head of claim 5, wherein the write portion includes a write pole shield.

7. The head of claim 1, wherein the sensor comprises a GMR sensor or a TMR sensor.

8. The head of claim 7, wherein the sensor includes at least one Current Perpendicular to the Plane Giant Magneto-Resistive (CPPGMR) sensor or Current In the Plane Giant Magneto-Resistive (CIPGMR) sensor.

9. A head for use in a perpendicular magnetic recording system, comprising:
   a read portion that includes a sensor, the sensor including a sense element having two free layers separated by a spacer layer; and
   a coil structure, coupled to the read portion, to provide bias flux to the sensor,
   wherein the bias flux causes magnetization in the two free layers to be configured with a bias angle of approximately 90 degrees.

10. A head for use in a perpendicular magnetic recording system, comprising:
    a write portion that includes a write pole and a write pole shield;
    a read portion that includes a sensor and read shields on opposing sides of the sensor;
    a via that magnetically connects the write pole shield and the read shields; and
    a coil structure, coupled to the read and write portions, to provide a desired write flux to the write pole by providing flux with a return through none or both of the read shields and the write pole shield,
    wherein the coil structure includes two coils and one of the coils carries a current in one direction and the other of the coils carries a current in the opposite direction during a write operation.

11. The head of claim 10, wherein the bias flux is provided to the sensor in a direction that is parallel to the plane of the sensor.

12. A head for use in a perpendicular magnetic recording system, comprising:
    a read portion that includes a sensor and read shields on opposing sides of the sensor;
    a write portion that includes a write pole and a write pole shield; and
    a coil structure, coupled to the read head portion, to provide bias flux to the sensor by providing flux to the read shields with a return path through the write pole shield,
    wherein the coil structure includes two coils and the coils carry current in the same direction during a read operation.

13. A disk drive comprising:
    a perpendicular recording disk;
    a head comprising a read portion to read information recorded on the perpendicular recording disk and a write portion to write information onto the perpendicular recording disk;
    a write pole and a write shield in the write portion;
    a sensor and read shields on opposing sides of the sensor in the read portion; and
    a coil structure, coupled to both the read and write portions, to provide a desired bias flux to the sensor during a read operation by providing flux to the read shields with a return path through the write pole shield during a read operation and write flux to the write pole with return paths through the write shield and one of the read shields during a write operation.

14. The disk drive of claim 13, wherein the sensor includes a sense element having two free layers separated by a spacer layer.

15. The disk drive of claim 13, wherein the sensor comprises a GMR sensor or a TMR sensor.

16. The disk drive of claim 15, wherein the sensor includes at least one Current Perpendicular to the Plane Giant Magneto-Resistive (CPPGMR) sensor or Current In the Plane Giant Magneto-Resistive (CIPGMR) sensor.

17. A disk drive comprising:
a perpendicular recording disk;
a head comprising a read portion to read information recorded on the perpendicular recording disk;
a sensor in the read portion, the sensor including a sense element having two free layers separated by a spacer layer; and
a coil structure, coupled to the read portion, to provide bias flux to the sensor,
wherein the bias flux causes magnetization in the two free layers to be configured with a bias angle of approximately 90 degrees.

18. The disk drive of claim 17, wherein the coil structure includes two coils.

19. The disk drive of claim 18, further comprising a write portion, and wherein at least one of the coils is located in the write portion.

20. A method of operating a magnetic recording head having a read potion, a write portion and a coil structure, the method comprising:
generating a magnetic flux using the coil structure; and
directing the flux to read shields on opposing sides of a sensor in the read portion with a return path through a write pole shield so as to provide a desired bias flux to the sensor during a read operation and directing the flux to a write pole in the write portion with return paths through one of the read shields and the write shield during a write operation.

21. The method of claim 20, wherein the sensor includes a sense element having two free layers separated by a spacer layer.

22. A method of operating a read head, comprising:
generating a bias flux; and
providing the bias flux to a sensor in the read head, the sensor including a sense element having two free layers separated by a spacer layer,
wherein the bias flux causes magnetization in the two free layers to be configured with a bias angle of approximately 90 degrees.

23. A magnetic recording head having both read and write portions, comprising:
means for generating a magnetic flux;
means for directing the flux to read shields on opposing sides of a sensor in the read portion with a return path through a write pole shield so as to provide a desired bias flux to the sensor during a read operation; and
means for directing the flux to a write pole in the write portion with return paths through one of the read shields and the write shield during a write operation.

24. The head of claim 23, wherein the sensor includes at least one Current Perpendicular to the Plane Giant Magneto-Resistive (CPPGMR) sensor or Current In the Plane Giant Magneto-Resistive (CIPGMR) sensor.

* * * * *